(12) United States Patent
Dale et al.

(10) Patent No.: US 6,958,605 B2
(45) Date of Patent: Oct. 25, 2005

(54) SYSTEM AND METHOD FOR PROVIDING REAL-TIME MOTION CORRECTION BY UTILIZING INTERNAL NAVIGATORS

(75) Inventors: Anders M. Dale, La Jolla, CA (US); Andre J. W. Van Der Kouwe, Woburn, MA (US)

(73) Assignee: The General Hospital Corporation, Boston, MA (US)

( * ) Notice: Subject to any disclaimer, the term of this patent is extended or adjusted under 35 U.S.C. 154(b) by 0 days.

(21) Appl. No.: 10/846,372

(22) Filed: May 14, 2004

(65) Prior Publication Data

US 2004/0210385 A1 Oct. 21, 2004

Related U.S. Application Data

(63) Continuation-in-part of application No. 09/853,011, filed on May 10, 2001, now Pat. No. 6,771,068.

(51) Int. Cl.[7] .................................................. G01V 3/00
(52) U.S. Cl. ...................................... 324/307; 324/306
(58) Field of Search ................................ 324/307, 306, 324/309, 312, 314, 300, 318, 322

(56) References Cited

U.S. PATENT DOCUMENTS

| | | | |
|---|---|---|---|
| 5,539,312 A | 7/1996 | Fu et al. | |
| 5,878,746 A | 3/1999 | Lemelson et al. | |
| 6,118,273 A | 9/2000 | Takizawa et al. | |
| 6,184,682 B1 | 2/2001 | Ehman et al. | |
| 6,307,369 B1 | 10/2001 | Felmlee et al. | |
| 6,516,210 B1 | 2/2003 | Foxall | |
| 6,541,970 B1 | 4/2003 | Takizawa et al. | |
| 6,771,068 B2 * | 8/2004 | Dale et al. ................... | 324/307 |
| 6,853,191 B1 * | 2/2005 | Miller et al. ................ | 324/309 |

OTHER PUBLICATIONS

Welch et al. (2001) "Spherical Navigator Echoes for 3–D Rigid Body Motion Detection", Proceedings of the International Society For Magnetic Resonance in Medicine 9th, p. 291: XP002207260.

Calhoun et al. (1998) "A frequency–space approach for motion correction in functional MRI", Image and Multidimensional Digital Signal Proceedings '98, pp. 59–62: XP002205345.

Atkinson et al. (2001) "Automatic Motion Correction Using Prior Knowledge", Proceedings of the International Society For Magnetic Resonance in Medicine 9th, p. 747: XP002205346.

Ward et al. (2000) "Prospective multiaxial motion correction for fMRI", Magnetic Resonance in Medicine 43, pp. 459–469: XP002175904.

(Continued)

*Primary Examiner*—Louis Arana
(74) *Attorney, Agent, or Firm*—Dorsey & Whitney LLP

(57) ABSTRACT

A method and system of correcting for a motion of an object are provided. In these system and method, the navigator data and map data are first obtained for the object. Then, the navigator data is compared with the map data to generate comparison data. Thereafter, a translation and/or a rotation of the object is corrected in real time as a function of the comparison data. The navigator can be preferably an octant navigator and/or a clover leaf navigator. In one exemplary embodiment, a scanning sequence can be used to determine a position of the object. This scanning sequence may include a signal portion which includes at least one radio frequency signal, a navigator portion which includes at least one octant navigator or one clover leaf navigator, and a spoiler portion provided for reducing a signal magnitude of the scanning sequence. The navigator is provided for allowing a measurement of at least one of the rotation and translation of the object. The navigator portion is advantageously provided between the signal portion and the spoiler portion.

22 Claims, 18 Drawing Sheets

OTHER PUBLICATIONS

James G. Pipe (1999) "Motion correction with PROPELLER MRI: application to head motion and free-breathing cardiac imaging", Magnetic Resonance in Medicine 42, pp. 963–969: XP002207261.

Halgren et al., "Location of Human Face–Selective Cortex With Respect to Retinotopic Areas" from Human Brain Mapping, 7:29–37, 1999.

Fisch et al., "High–Resolution Intersubject Averaging and a Coordinate System for the Cortical Surface" from Human Brain Mapping, 8:272–284, 1999.

Tootell et al., "Functional Analysis of V3A and Related Areas in Human Visual Cortex", Journal of Neuroscience, Sep. 15, 1997, 17:7060–7078.

Thesen et al., "Prospective Acquisition Correction for Head Motion With Image–Based tracking for Real–Time fMRI" Magnetic Resonance in Medicine 44:457–465, 2000.

Dale et al., "Dynamic Statistical Parametric Mapping: Combiing fMRI and MEG for High–Resolution Imaging of Cortical Activity", Neuron, vol. 26, pp. 55–67, Apr. 2000.

A.J. van der Kouwe et al., "Rapid Real–Time Prospective Rigid Body Motion Correction During Imaging Using Clover–Leaf Navigators" Twelfth Scientific Meeting and Exhibition, May 2004.

Fischl et al., "Measuring the thickness of the human cerebral cortex from magnetic resonance images", PNAS, vol. 97, No. 20, pp. 11050–11055, Sep. 26, 2000.

* cited by examiner

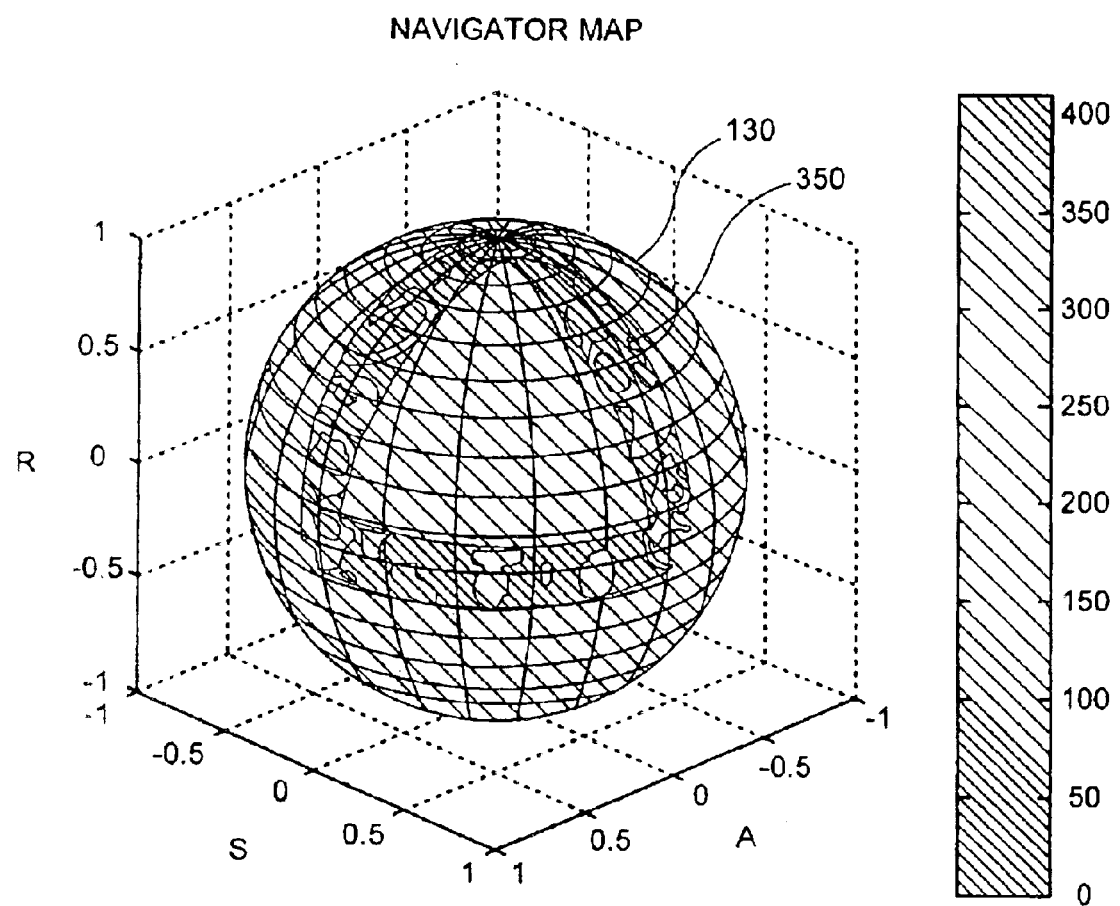
F I G. 9

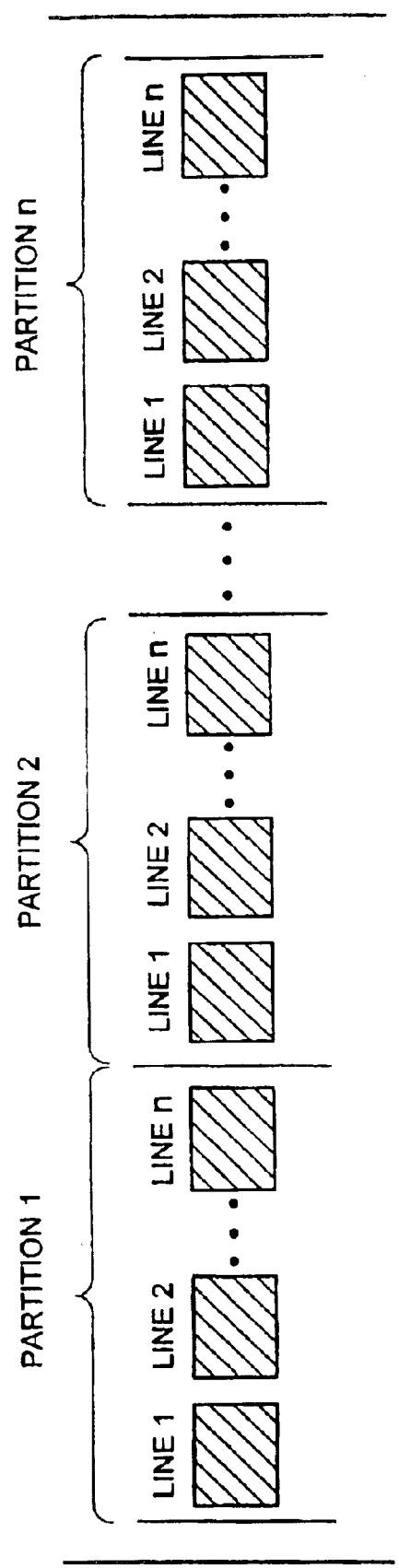
F I G. 11

SYSTEM AND METHOD FOR PROVIDING REAL-TIME MOTION CORRECTION BY UTILIZING INTERNAL NAVIGATORS

RELATED APPLICATION

This is a continuation-in-part application of U.S. application Ser. No. 09/853,011, which was filed on May 10, 2001, now U.S. Pat. No. 6,771,068, the entire disclosure of which is incorporated herein by reference.

FIELD OF THE INVENTION

The present invention relates to a system and method for tracking and correcting, in real-time, a motion of an anatomical object. In particular, the system and method uses octant and/or clover leaf navigators to track and correct certain features of the anatomical object (e.g., a brain) during a three dimensional scan thereof.

BACKGROUND OF THE INVENTION

Several approaches have been utilized to correct for a movement of a subject during scans. Such conventional methods require an off-line, post-processing of the images. Indeed, an image correction is not theoretically possible in some cases because certain areas of k-space may not be sampled, while others are oversampled. The earliest navigator-based methods for the motion correction utilized straight-line navigators to detect a linear motion. Such technique may be useful in chest examinations where the diaphragm and associated organs translate along a particular axis. However, these conventional methods do not quantify and determine the magnitudes or degrees of rotations of the objects being examined, or portions thereof.

Other conventional systems and methods use correlated volumes to calculate rotations and translations. While this technique allows for a correction of certain types of motions, it cannot be applied to three dimensional single image structural scans. Indeed, the techniques employed by these systems and methods are computationally intensive. Similar approaches have been used on-line and off-line for two dimensional sequences. In particular, slices can be correlated to calculate the transformation from one slice to the next, and correct for such changes. However, while this conventional method has certain benefits, the correction of the motion provided therein only applies to the object motion for an in-plane movement.

Another conventional approach for the motion correction utilizes a set of navigator pulses. For example, circular navigators have been proposed to gauge a rotation within sequences. The circular navigators are 30 ms in duration, and three of these circular navigators are required to characterize the motion of the object about three cardinal axes. An iterative approach is then taken to correct the motion of the object since the navigators are not usable for the out of plane rotations. Therefore, this conventional method provides an approximate correction. Another set of three circular navigators is then acquired for a final (fine) adjustment. While this approach fulfills the theoretical need to compensate for all three axes of motions, there are certain impracticalities associated with such conventional approach. Most importantly, the entire procedure is relatively time-consuming, i.e., adding this procedure to, e.g., a standard functional magnetic resonance imaging ("fMRI") acquisition sequence is not practical.

SUMMARY AND OBJECTS OF THE INVENTION

It is therefore the object of the present invention to use navigator echoes during each radio frequency acquisition to track the motion of an object (e.g., the head of a patient) and to compensate for such motion by correcting the gradients during the scan thereof. Another object of the present invention is to utilize the navigators to track and correct for a motion of the object in real-time. Yet another object of the present invention is to provide an improvement in the basic signals to measure the brain physiologic changes that are being investigated. Another object of the present invention is to improve the quality of anatomical images obtained. Still another object of the present invention is to assess (and possibly measure and record) the rigid-body motion (e.g., rotations and translations in 3 dimensions) without necessarily correcting for it.

These and other objects of the present invention are achieved with a method and system for correcting for a motion of an object. In this system and method, the navigator data and map data are obtained for the object. Then, the navigator data is compared to the map data to generate comparison data. A translation and/or a rotation of the object is corrected, in real time, as a function of the comparison data. In an exemplary embodiment of the present invention, the navigator can be an octant navigator or a clover leaf navigator.

In an exemplary embodiment of the present invention, a scanning sequence can be used to determine a position of the object. This scanning sequence may include a signal portion which includes at least one radio frequency signal, a navigator portion which includes at least one navigator, and a spoiler portion provided for reducing a signal magnitude of the scanning sequence. The navigator is provided for allowing a measurement of at least one of a rotation and a translation of the object. The navigator portion is advantageously provided between the signal portion and the spoiler portion.

In another embodiment of the present invention, the navigator may be an octant navigator or a clover leaf navigator. The octant navigator traces an octant path on the surface of a sphere in k-space. This enables a rotation about the three cardinal axes, and a translation in all three directions to be achieved in a single read after a single radio frequency pulse.

According to a further exemplary embodiment of the present invention, the clover leaf navigator may trace a path through k-space (or a phase space), that includes a straight-line section in each direction through the center of k-space to gauge translations, and also includes approximately ninety degree arcs in three perpendicular planes to gauge rotations.

It is also advantageous, according to the present invention, to first obtain a pre-mapping of the region of k-space a small number of degrees in each direction from the initial navigator. This pre-mapping technique preferably eliminates the need for an iterative, approximate solution. By comparing the actual navigator with a local pre-mapped k-space map, it is possible to determine the true rotations and translations using a single subsequent navigator. It is preferable that the rotations are not so large as to shift the navigator outside the boundaries of the map. Since the gradients can be preferably corrected after each navigator is acquired, the accumulated rotation may exceed the limits of the map, provided that the inter-navigator rotation is constrained by the limits of the map or that the error landscape in the region between the target navigator and the current navigator is convex.

In still another embodiment of the present invention, the pre-mapping technique may be combined with an optimal radius selection method using concentric navigators. This procedure selects the optimal radius for an individual object to be used for the navigators in the map, and along with the subsequent navigators. Also, the optimal offset angles relative to each of the three axes may be selected. The navigators can also be inserted between the phase steps of a three-dimensional sequence to obtain a single motion corrected structural scan. They can also be inserted within and/or between the volumes of a three dimensional or single slice two dimensional echo planar image used for functional imaging or diffusion imaging. Further, a slab selection may be used to eliminate parts that do not move as a rigid body with the part of interest.

According to an exemplary embodiment of the present invention, the path of the navigator does not have to be the edge of an octant or in the shape of a clover leaf. In fact, any path on a sphere in k-space may be traced. Indeed, any path that extends in all three dimensions (i.e., preferably not a path that lies completely within a single plane) may be utilized. It is within the scope of the present invention to extract the navigator information. While all paths do not have to be equal or yield the same SNR in the rotation/translation estimates, the use of the octant and/or clover leaf is preferable. According to the present invention, a preliminary exploration and analysis of the k-space representation of a volume can yield an optimal path. It is possible, with an appropriate spoiling, to implement this exemplary scheme in two dimensional sequences. In this case, more than one map may be collected to gauge the effect on the navigators of the excitation of the different slices due to the imaging part of the sequence.

One of the exemplary advantages of the present invention is that it utilizes a navigator that is capable of reading in a single path (which may use only one radio frequency ("RF") pulse that may be shared with the imaging part of the sequence. It is also within the scope of the present invention not to require an additional RF pulse for the navigator which can fully qualify a rigid body motion (rotations/translations) for which the navigator should occupy 3 dimensions, i.e. preferably not contained within a plane. The navigators used by the present invention can be applicable in 2 dimensional and 3 dimensional sequences for motion correction.

In still another exemplary embodiment of the present invention, quaternions can be used to describe rotations. For example, quaternions avoid the problem of gimbal lock that occurs when angle rotations are described relative to the cardinal axes. Moreover, unlike matrices, quaternions always represent a rigid body rotation and do not accumulate errors over successive multiplications. This is important in feedback cases where a series of small corrections is applied to the gradient rotation.

In a further exemplary embodiment of the present invention, a feedback control system can be used to repeatedly correct the translations and/or rotations of the gradients so that they track and possibly predict the motion of an object. An exemplary control mechanism could be a Kalman filter.

BRIEF DESCRIPTION OF THE DRAWINGS

For a more complete understanding of the present invention and its advantages, reference is now made to the following description, taken in conjunction with the accompanying drawings, in which:

FIG. 9 shows an exemplary map of a region of k-space surrounding edges of the octant navigator;

FIG. 11 shows an illustration of the navigators arranged in a predetermined number of partitions, each having a particular number of lines;

DETAILED DESCRIPTION OF THE INVENTION

Figure 1:
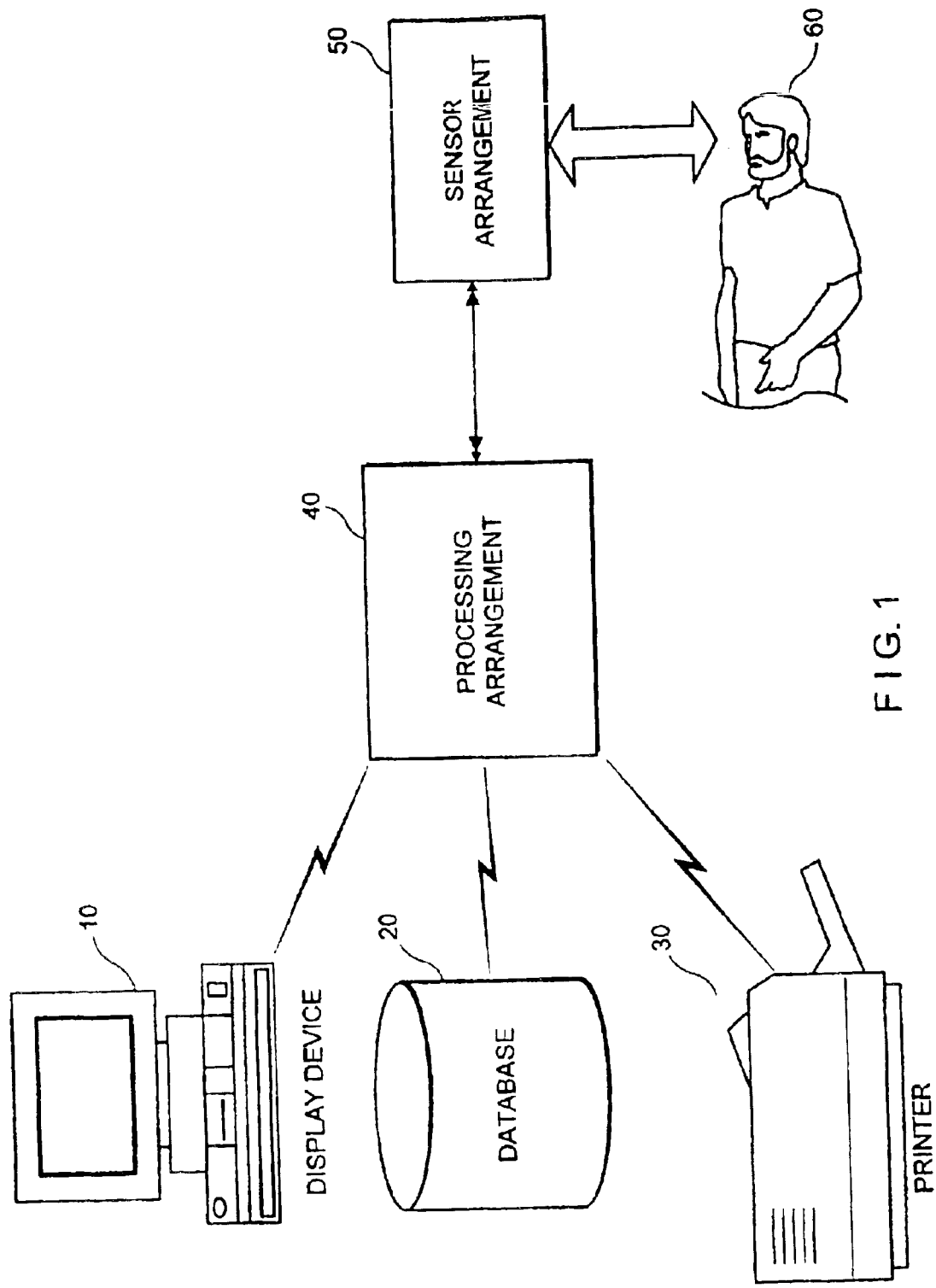
FIG. 1 shows an exemplary embodiment of a system according to the present invention which tracks and corrects a motion of an anatomical object in real time.

An exemplary embodiment of a system according to the present invention which tracks and corrects a motion of an anatomical object in real time is illustrated in FIG. 1. As shown, this system includes a processing arrangement 40 which is connected (either wirelessly or via a wired connection) to a sensor arrangement 50. The sensor arrangement 50 can be a conventional magnetic resonance ("MR") sensor arrangement with which a subject 60 can be scanned. The exemplary conventional sensor arrangement is described in U.S. Pat. No. 6,118,273, the entire disclosure of which is incorporated herein by reference.

For example, this conventional sensor arrangement generally includes a gradient magnetic field coil which is designed to generate a gradient magnetic field, a radio-frequency ("RF") coil which is designed to generate a high frequency magnetic field in the magnetic field region, and an RF probe which is designed to detect the MR signals generated from the subject 60. It is known to use gradient field coil units in the gradient magnetic field coil which are provided in three axial directions, crossing perpendicular to one another.

The sensor arrangement 50 may also include a magnetic field source which can be actuated so that the coil units generate the gradient magnetic fields in response to the signals of the coil. With the gradient field coil units, the magnetic fields in three axial directions (e.g., slicing, phase encoding and readout directions) can be applied to the space where the subject 60 is positioned. Using the sensor arrangement 50, the RF coil generates a high frequency magnetic field in the form of a pulse to respond to the signals generated by an RF transmitter which is also an element of the sensor arrangement 50. An RF probe, which is provided substantially near the subject 60, generates the RF signals which are detected by signal detector of the sensor arrangement 50. Further details of the conventional sensor arrangement 50 are provided in U.S. Pat. No. 6,118,273.

These RF signals (or data equivalent therefore) are received by the processing arrangement 40 which can be a general purpose computer (e.g., a Pentiume based computer), a specific purpose computer, or more than one computer or combination of computer(s) and special purpose hardware, especially designed to receive and process the data corresponding to the RF signals. After the processing arrangement 40 receives the RF signals, it determines if and to what extent at least a portion of the subject 60 that is being scanned has moved or rotated by tracking the subject 60. If the processing arrangement 40 determines that at least a portion of the subject 60 has moved (e.g., the patient's head), the processing arrangement 40 corrects this motion in real time using the data it obtained regarding such movement. In accordance with an exemplary embodiment of the present invention, this data can include a series of navigators, which may be octant navigators and/or clover leaf navigators.

The navigator is generally known as a scanning sequence which can be used for determining and acquiring positional data. The navigator measures a rotation of an object about the three cardinal axes, and the object's translation along each axis. The navigator may be an octant navigator which, using a path through k-space (or a phase space), circumscribes an octant on a spherical surface which can be related to the object. The path used by the octant navigator can be understood as approximately similar to a trace of a quarter of a circle in each of the x-y, y-z and z-x planes. Alternatively, the navigator may be a clover leaf navigator, which traces a path through k-space that includes a straight-line section in each direction through the center of k-space to gauge translations, and approximately ninety degree arcs in three perpendicular planes to gauge rotations.

Figure 2:
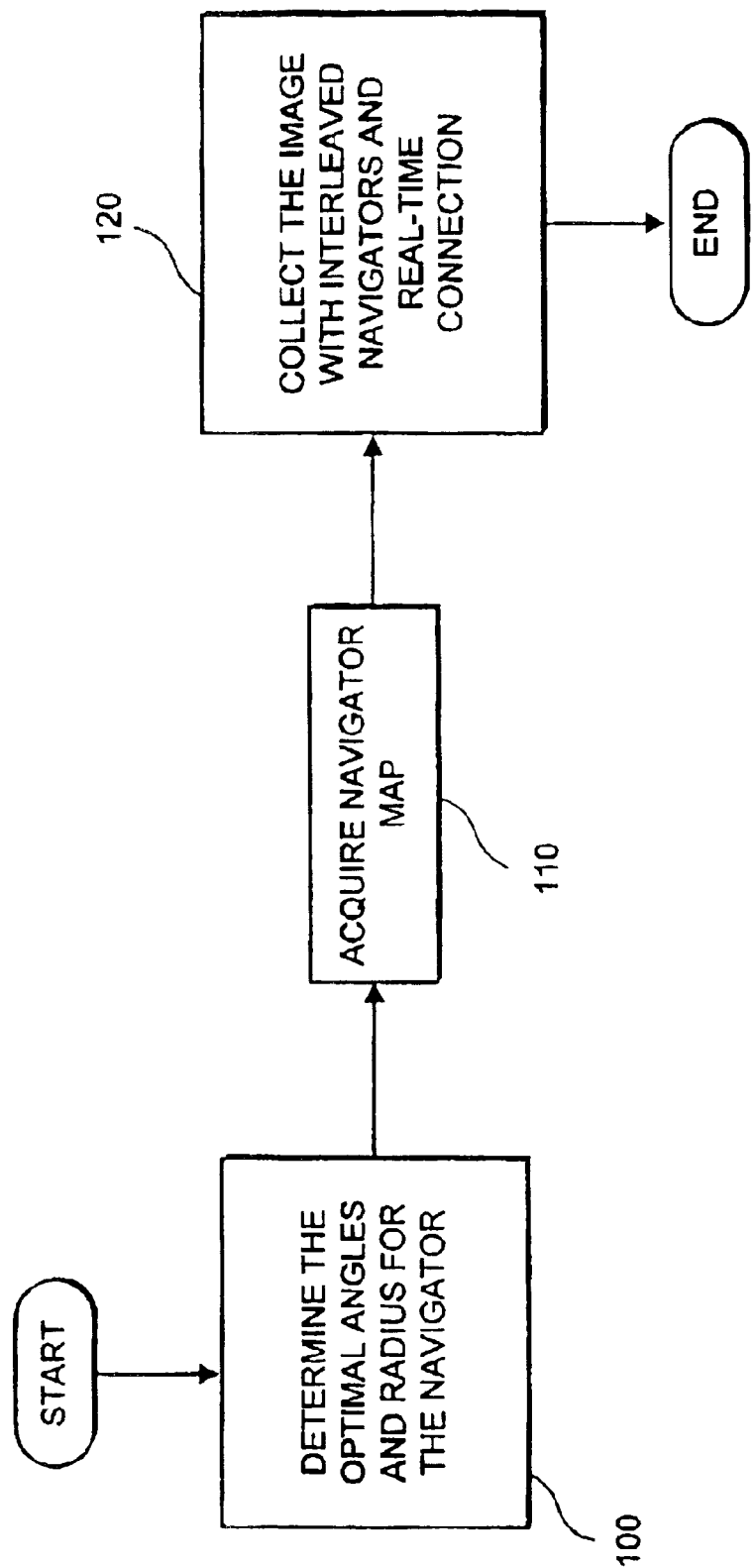
FIG. 2 shows an exemplary embodiment of a method according to the present invention for tracking and correcting a motion of an anatomical object in real time.

FIG. 2 shows an exemplary embodiment of a top-level diagram of the method for tracking and correcting a motion of an anatomical object, in real time, using the octant and/or clover leaf navigators in accordance with the present invention (collectively referred to as the "navigators"). This exemplary method may be implemented by the processing arrangement 40 of the present invention illustrated in FIG. 1. As shown in FIG. 2, the optimal radius and optimal angles for the navigators are determined in step 100. Then, in step 110, the map of the navigators is obtained, i.e., prior to the scanning procedure. Finally, the images with the interleaved navigators are established and collected (step 120). In addition, the image is preferably corrected using the map obtained in step 110, and the motion data corresponding to the motion and rotation of the object, which was determined using the navigators.

Exemplary Embodiment Employing Navigators (e.g., Octant Navigators)

Figure 3:
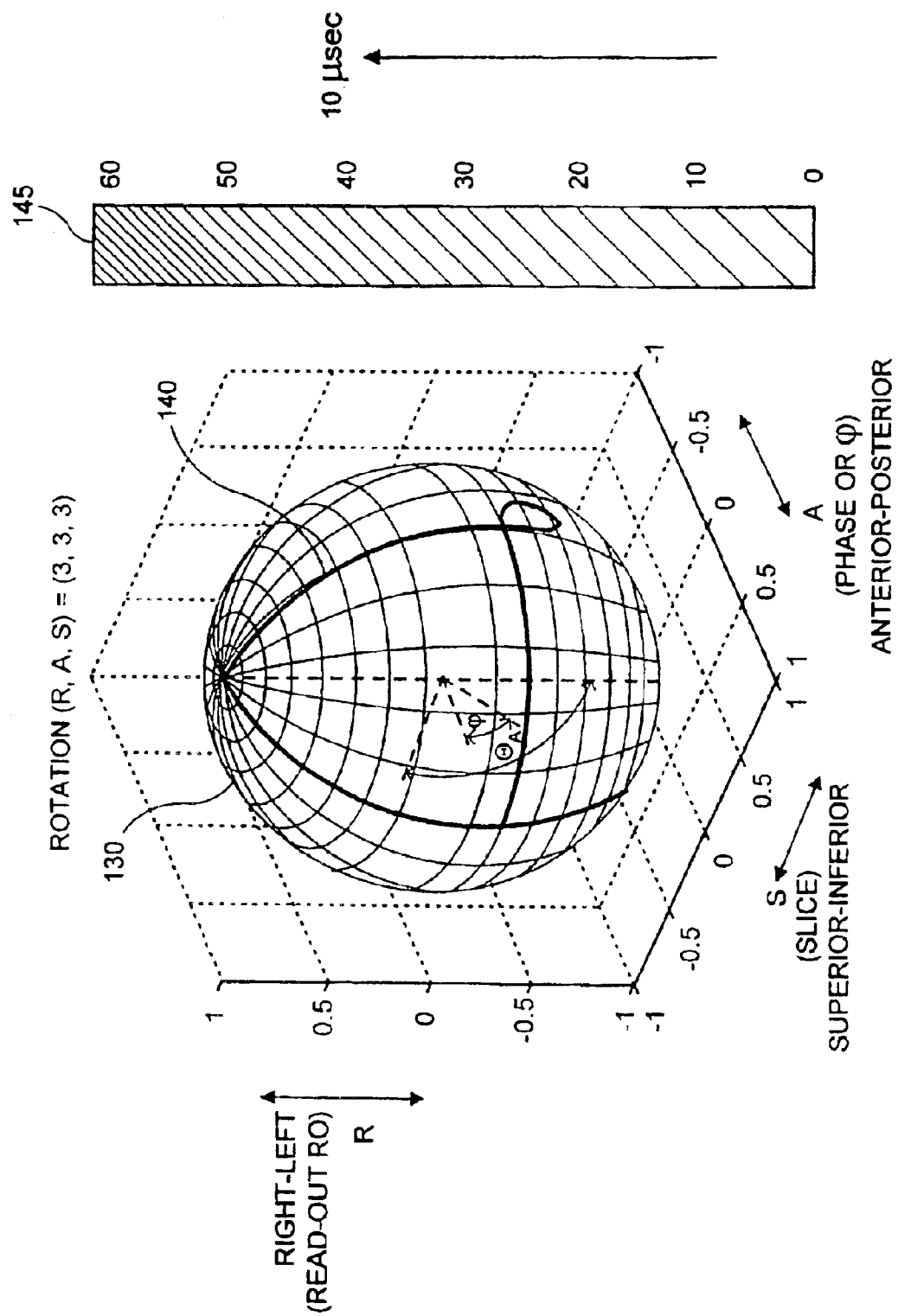
FIG. 3 shows an illustration of an exemplary navigator path in k-space that circumscribes a particular section (e.g., an octant) on a spherical surface of k-space.

FIG. 3 illustrates an exemplary k-space path or trajectory 140 of the octant navigator shown on a surface of a sphere 130 which preferably relates to the object to be tracked. As shown in this drawing, the rotation about all three axes is sampled in a single exemplary sweep. For example, the axis R in the drawing corresponds to right-left axis, A to anterior-posterior axis, and S to superior-inferior axis (which anatomy correspond to the physical slice, phase and read-out directions according to the orientation of the subject in the magnetic field). This exemplary path 140 of the octant navigator is preferably used during step 100 of the method shown in FIG. 2 (i.e., the determination of the optimal radius $\Delta$ and angles $1_A$ for the octant navigators). A varying gray-scale bar 145 is provided near the sphere 130 and the path 140 to show the time (e.g., in tenths of milliseconds) that it takes certain portions of the path to be traced and/or sampled. The sampling time can be adjusted according to the desired signal to noise ratio ("SNR"), e.g., a time of less than 1.5 ms for the octant navigator portion is also possible. As shall be described in further detail below, the octant navigators are preferably formed using the gradients of control signals generated by the sensor arrangement 50 on the three axes. These gradients are used in a k-space readout for tracing the edge of the octant of the sphere 130, and to form the path 140 for the octant navigators. The quadrant of the circles (i.e., of the sphere 130) can be achieved by using, e.g., sinusoidal gradients.

Figure 4:
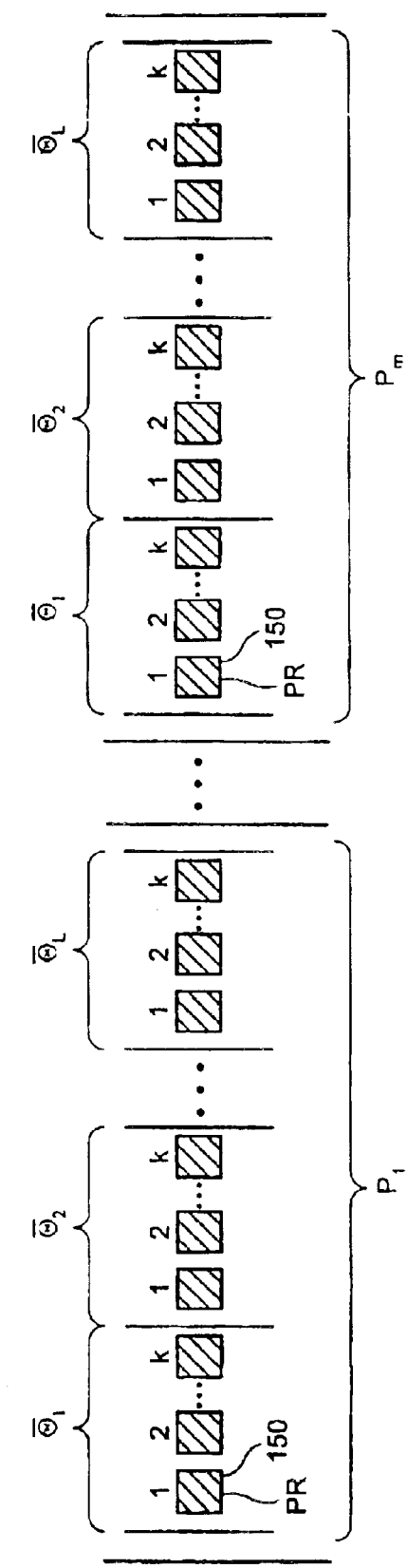
FIG. 4 shows an exemplary sequence structure provided to determine an optimum radius and offset angles for a navigator.
Figure 5:
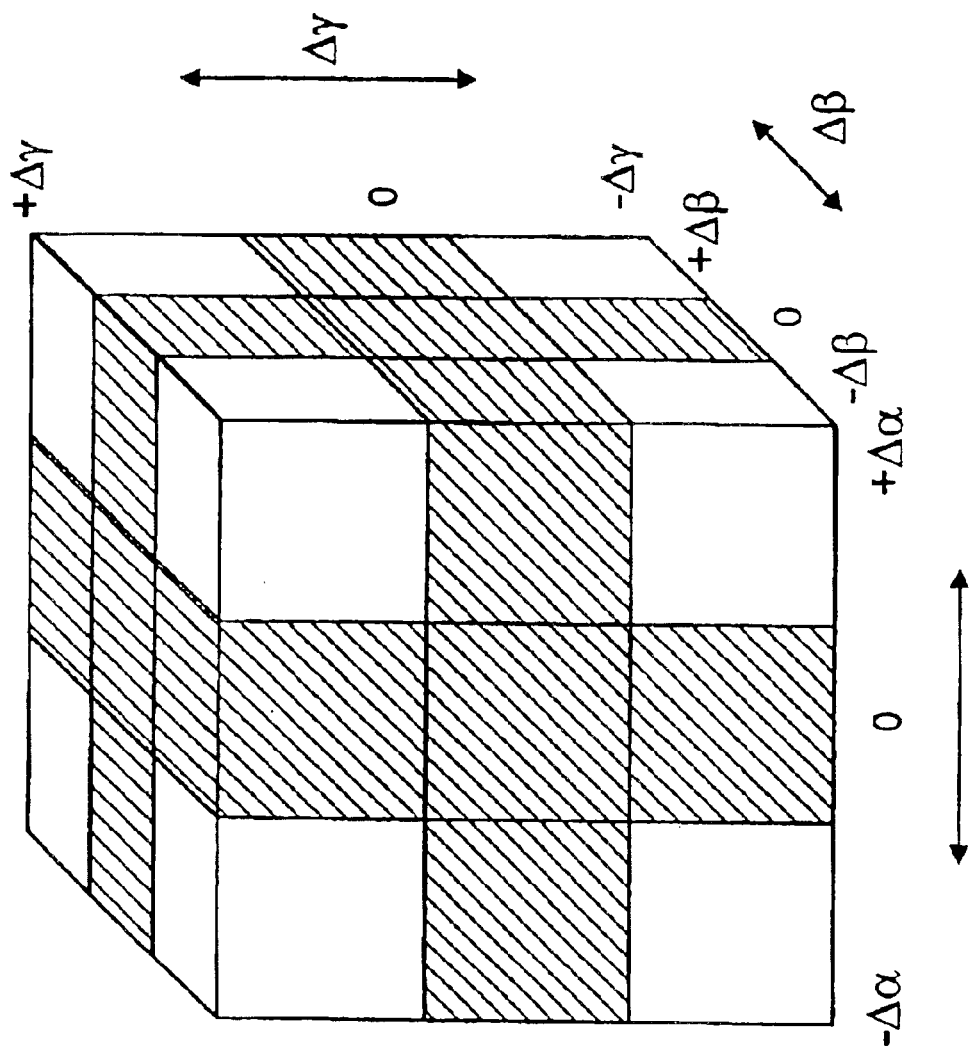
FIG. 5 shows an exemplary illustration of possible combinations of perturbations that are tested by the system and method according to the present invention.

An exemplary sequence pre-scan structure is shown in FIG. 4. This structure provides individual octant navigator pulse sequence kernels 150 (as shall be described in more detail below) for each perturbation (i.e., small angle or movement), for each offset or base angle and for each radius of the path 140. As shown in this drawing, the exemplary structure may include K-number of perturbations for each of L-number of offset/base angles (e.g., 6 base angles) and M-number of radii (e.g., 16 sampled radii). Thus, the sequence of kernels 150 should be tested for K×L×M times. The offset/base angles $\theta_A$ can be a set of large angles, e.g., ($\pi/4$, $-\pi/4$, 0) (offsets in radians relative to the three axes), and the perturbations PR can be denoted by ($\Delta\alpha$, $\Delta\beta$, $\Delta\gamma$), where $\Delta\alpha$, $\Delta\beta$, and $\Delta\gamma$ are small angles such as, e.g., 1°. An exemplary illustration of the perturbations scheme is illustrated in FIG. 5.

It should be understood that both the accuracy of the information provided by the sequence kernels 150 and the timing to obtain the optimal radius and angles for the octant navigators must be considered. While the accuracy of the information determined from the sequence kernels 150 is enhanced by sampling a large number of perturbations PR, a large number of the base angles $\theta_A$ and a large number of radii $\Delta$, the time to obtain such accurate information can be significant. However, while utilizing a small number of the perturbations PR, base angles $\theta_A$ and radii $\Delta$ may reduce the processing time, the accuracy of the results could be reduced to a point of unusability.

Therefore, the number of the perturbations PR, base angles $\theta_A$ and radii $\Delta$ should be set so that an acceptable accuracy is obtained, while the time it takes to determine the optimal radius and angles is also reasonable. In one exemplary embodiment of the present invention, the sequence is tested for 19 perturbations PR for each of the 6 offset/base angles $1_A$. In this exemplary embodiment, the set of 6 base angles $\theta_{A1}$ is provided for each of 16 radii $\Delta$. The 19 perturbations is, e.g., the minimum number of small perturbations required to fit a quadratic function in 3 dimensions to the local error landscape, where the error is between the central and the perturbed navigator signal vectors. Thus, the number of tests performed on the sequence is 19×6×16. It should be understood that other combinations of perturbations, offset/base angle and radii numbers are conceivable, and are within the scope of the present invention.

Figure 6:
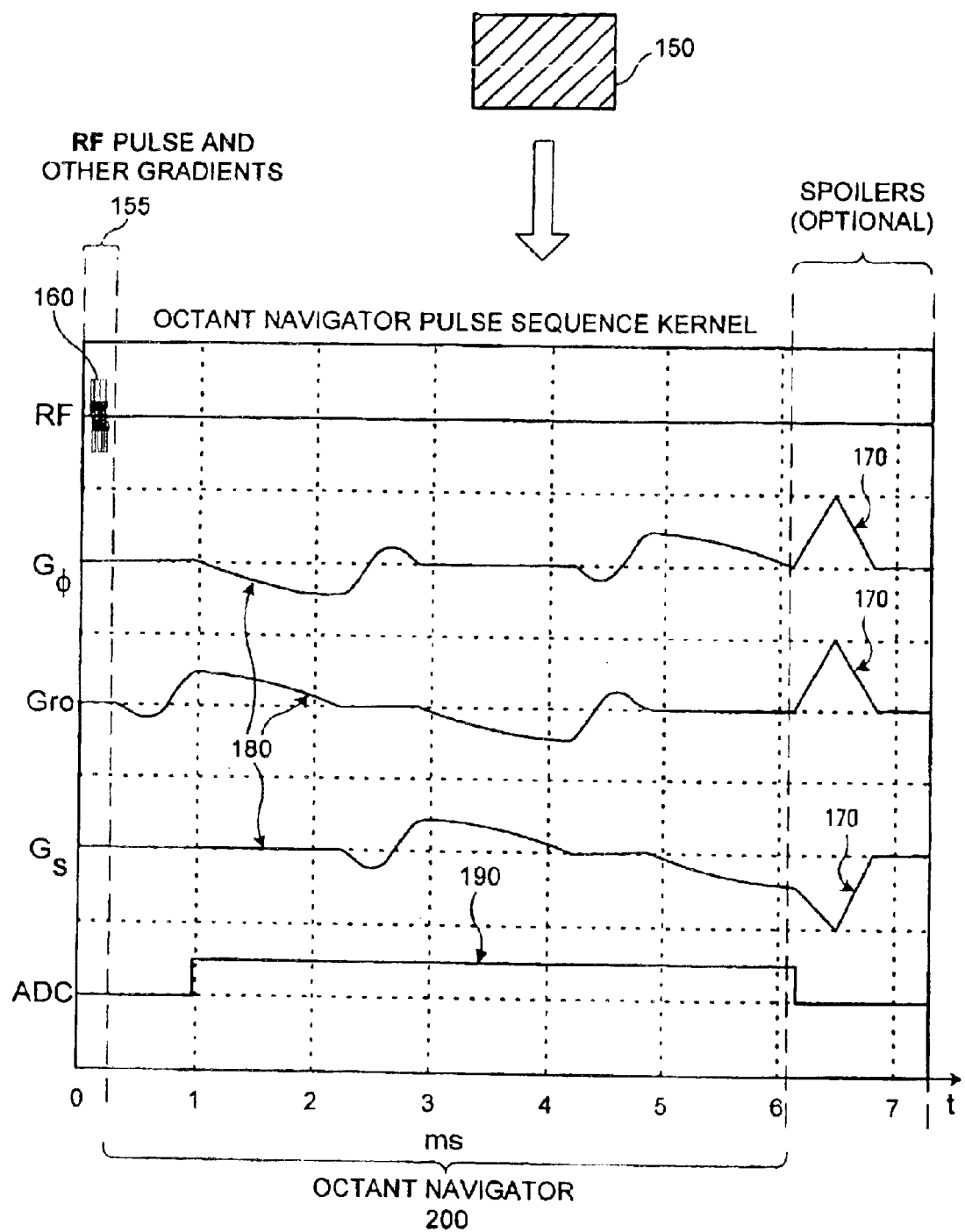
FIG. 6 shows an exemplary octant navigator pulse sequence kernel according to the present invention.
Figure 7:
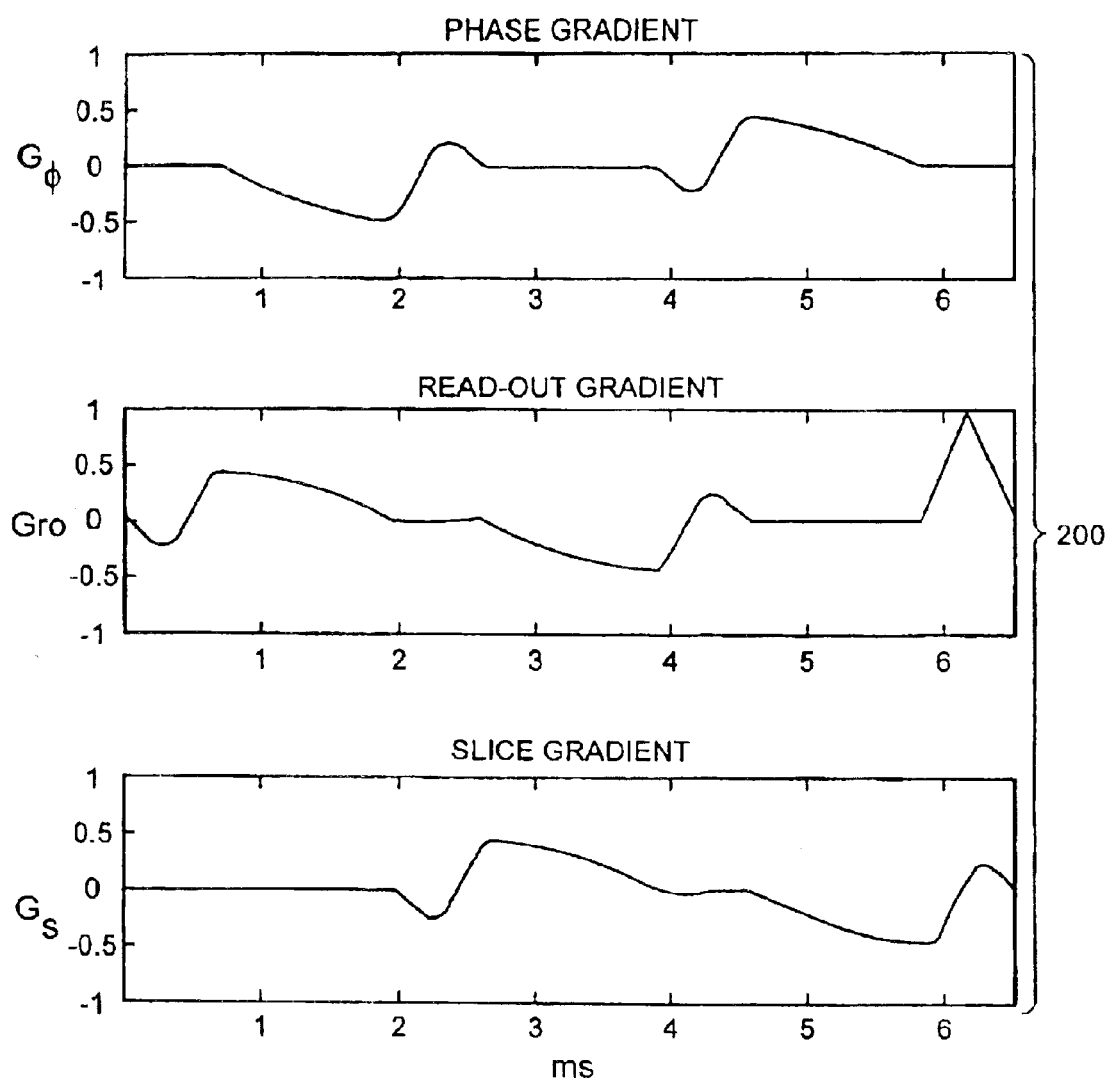
FIG. 7 shows an enlarged illustration of exemplary gradient control signals as provided in the navigator pulse sequence kernel of FIG. 6.

FIG. 6 shows a graph of an embodiment of an exemplary octant navigator pulse sequence kernel 150, which includes a first section of gradient control signals 155, a second section of radio frequency (RF) pulses 160 and other (e.g., slab-selective) gradients which are provided immediately before the first portion (i.e., before the section of the gradient control signals), and a third portion for spoiler gradients 170 immediately following the first section 155. Thus, the first section, which includes the gradient control signals is provided between the second and third portions. The exemplary second portion includes three gradients 180, i.e., a phase gradient $G_\phi$, a readout gradient $G_{ro}$ and a slice gradient $G_S$. An enlarged view of the exemplary enlarged illustration of the gradients which form the octant navigator 200 is shown in FIG. 7. The spoiler gradients 170 are provided immediately following the gradient control signals $G_N$, $G_{ro}$, $G_S$ to spoil or reduce the magnitude of the transverse magnetization that might otherwise remain and contribute as noise in the subsequent read of the next image line and navigator. In case of the readout gradient $G_{ro}$, the spoiler gradient 170 associated therewith substantially suppresses further echoes in the subsequent blocks of the sequence. FIG. 6 also shows that an analog-to-digital converter ("ADC") 190 provides a read-out signal, which occurs during a central part of the gradient waveforms. During this time, the octant navigator 200 and the transitions at the navigator's corners are traced out. In an exemplary embodiment of the present invention, the samples acquired during the two corner transitions are discarded, and the remaining three series of samples constitute the octant navigators 200 for the right-left or R axis, anterior-posterior or A axis and superior-inferior or S axis.

As an example, the flip angle of the RF pulse 160 should preferably match the angle of the sequence in which the octant navigator pulse sequence kernel 150 is embedded, and should match the flip angle of the navigator kernel in the map. If the octant navigator pulse sequence kernel 150 includes a slab-selective pulse, a slab selective gradient pulse can simultaneously be applied on the read out gradient $G_{ro}$ (e.g., in the superior-inferior direction) to eliminate certain portions of the subject 60 from the navigator due to their inability to rigidly transform when a portion of the subject 60 moves. These unwanted portions may be the neck or lower jaw of a patient. If this is the case, the navigator may be in a block of its own (i.e., with its own RF pulse) so that the image itself will not be also subject to the slab selection and the neck/jaw disappear from the final image volume.

Figure 8:
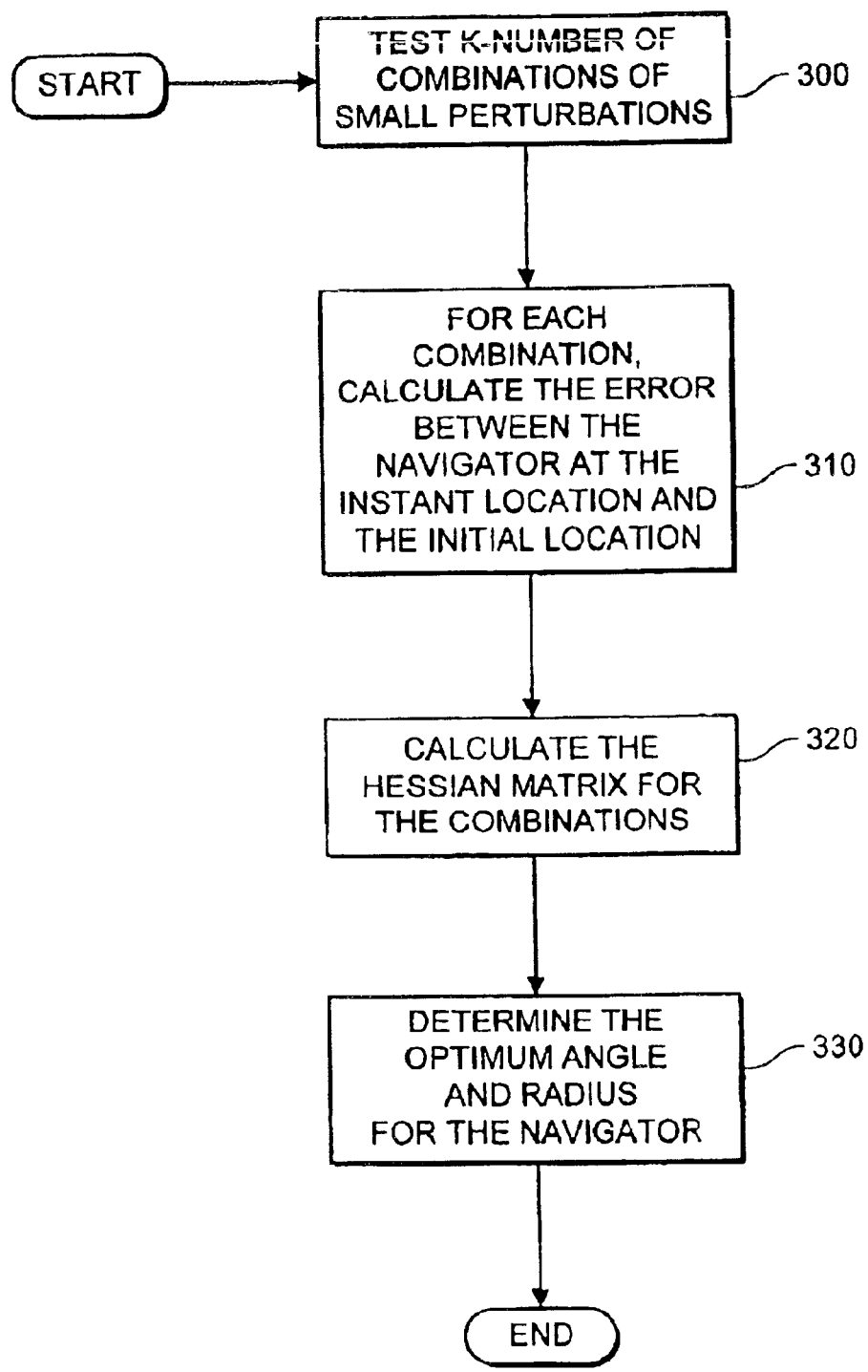
FIG. 8 shows a detailed illustration of a portion of the method according to the present invention in which optimal radius and angles are determined.

FIG. 8 shows a flow diagram of an exemplary embodiment of the method according to the present invention to determine the optimal radius and the optimal angles for the octant navigator. In particular, K-number of combinations of perturbations PR are tested (i.e., for each offset/base angle and each radius) in step 300. Then, an error between the octant navigator at a current location and as initially positioned is calculated for each combination in step 310. Upon the completion of step 310, a Hessian matrix is calculated as a mean square difference using the matrix of the calculated errors (in step 320) as follows:

$$H(\Theta, \rho) = \frac{\partial^2 E}{\partial B^2},$$

where E is a matrix of errors ($E_{ijk}$), $E_{ijk} = N_{ijk} - N_o$,
$N_{ijk}$ is the octant navigator at ($i.\Delta\alpha$, $j.\Delta\beta$, $k.\Delta\gamma$),
$N_o$ is the octant navigator at the initial location, and
$B = (\Delta\alpha, \Delta\beta, \Delta\gamma)$,
and i, j, k are all the combinations of i, j, k $\in \{-1, 0, 1\}$
such that $|i|+|j|+|k| \leq 2$, i.e. 19 combinations.

Then, to determine the optimal angle and radius of the octant navigator (step 330), the eigen values of $H(\theta, \rho)$ can be utilized to characterize the error surface for $\theta$, $\rho$ as follows. For example, a set of 3 eigen values can be found for $H(\theta, \rho)$. Then, if $$D = \prod_{i=1}^{3} \lambda_i$$

(where D is a product of eigen values), the $\theta$, $\rho$ combination for which D is maximal is determined as the optimal selection for the angle and radius of the octant navigator. It is preferable that the method according to the present invention ensures that all eigen values are positive for this $D(\theta, \rho)$. Thereafter, the optimal angle $\theta$ and the optimal radius $\rho$ are passed to the next step in the process to obtain the navigator map (step 110 shown in FIG. 2).

Thereafter, the method and system according to the present invention preferably acquires the octant navigator map (step 110 of FIG. 2). The navigator map consists of a series of the navigator kernels 150 rotated at various angles. The angles are adjusted, e.g., in pairs so that lines in k-space parallel to each edge of the octant (on the surface of the sphere 130) are collected. In one exemplary implementation of the present invention, the entire navigator map can be acquired in approximately 3 seconds. An example of the navigator map consisting of 31 lines parallel to each edge of the octant, illustrated on the surface of the sphere 130, is shown in FIG. 9. As shown in this drawing, a map region 350 provides the borders surrounding three edges of the octant navigator. Thus within the map region 350, it is possible to track the motion and/or rotation of at least a portion of the subject to which corresponds the position, angle and direction of the respective octant navigators.

Figure 10:
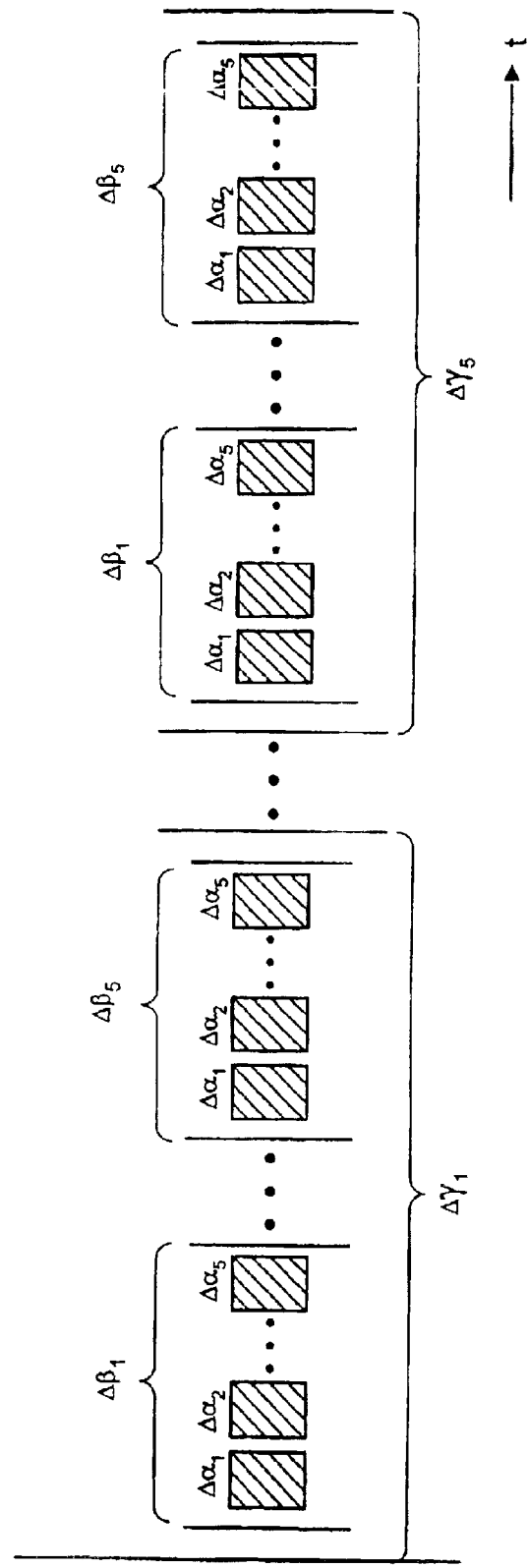
FIG. 10 shows an exemplary structure for the map illustrated in FIG. 9.

The navigator map shown in FIG. 9 can be acquired using an exemplary sequence map structure illustrated in FIG. 10 that is illustrated for the entire path 140 of the octant navigator. This exemplary sequence structure illustrates how the region 350 can be mapped by selecting n×n×n (e.g., 5×5×5) combinations of the perturbations PR of the octant navigator 150 ($\Delta\alpha$, $\Delta\beta$, $\Delta\gamma$). In the exemplary 5×5×5 sequence map, every combination of 5 angles close to zero can be acquired therein. Although this procedure measures the data directly, a large amount of the data is most likely not unique. It is preferable to acquire the angles which are provided at a few degrees to either side of each edge of the octant. In this manner the resolution is greater, and the space can be efficiently sampled. The details of this technique shall be described in further detail below.

For an exemplary n×n×n implementation of the sequence map structure, the structure can be defined as a rotation map (δ) which is the collection of the octant navigators for the following rotations:

$$\{q(\alpha,\beta,\gamma)|\alpha \in C \cup \beta \in C \cup \gamma \in C\}$$

where C={−δ, −δ+2δ/(n−1), −δ+2.2δ/(n−1), . . . , δ} or a set of n angles appropriate to the expected range (±δ) of the motion of the subject, and q is the quaternion by which the navigator is rotated, defined by:

$$q(\alpha,\beta,\gamma) = q_{\alpha,\underline{RR}} \cdot q_{\beta,\underline{RA}} \cdot q_{\gamma,\underline{RS}} \text{ and}$$

$$q(\theta,\phi,\varphi) = q_{\alpha\theta,\underline{RRA}} \cdot q_{\beta\phi,\underline{RAS}} \cdot q_{\gamma\varphi,\underline{RRS}}$$

where $\underline{RR}$=[+1, 0, 0],
$\underline{RA}$=[0, +1, 0],
$\underline{RS}$=[0, 0, +1],
$\underline{RRA}$=(1/√2).[+1, −1, 0],
$\underline{RAS}$=(1/√2).[0, +1, −1], and
$\underline{RRS}$=(1/√2).[−1, 0, +1], where $q_{\theta,\underline{R}}$ is a quaternion representing a rotation of θ about the vector $\underline{R}$ in the RAS coordinate system.

In particular, it is possible to collect the octant navigators pre-turned about the optimal angle 1 and at the optimal radius Δ using the following:

∈∀=−2∈∀, −∈∀, 0, ∈∀, 2∈∀,

∈∃=−2∈∃, −∈∃, 0, ∈∃, 2∈∃, and

∈∃=−2∈∃, −∈∃, 0, ∈∃, 2∈∃, thus providing 5×5×5=125 combinations for each of, e.g., three maps, with the optimal angles having the values of 10E, 3E and 1E.

It is also possible to select q+q+q (e.g., 31+31+31) combinations of the perturbations PR, where each angle is perturbated separately, as follows:

31 steps of ∈∀, with ∈∃=∈∃=0, 31 steps of ∈∃, with ∈∀=∈∃=0, and 31 steps of ∈∃, with ∈∀=∈∃=0.

Thus, the q+q+q rotation map is the collection of octant navigators along the path of the octant navigators, and the rotations can be defined as $\{q(\theta,\phi,\varphi)|(\theta,\phi,\varphi) \in \{(C,0,0) \cup (0,C,0) \cup (0,0,C)\}\}$, with the variables being defined above in a similar manner as for the n×n×n rotation sequence map. C can be defined as, e.g., a set of 31 angles spanning the extent of the desired map in each direction, and dependent on the expected maximum inter-navigator rotation.

Thereafter, a post-processing procedure can be implemented to interpolate the q+q+q rotation sequence map. By using this map, the data for the arbitrary combinations of angles is preferably calculated from the initial sequence map. An interpolation of scalar values on the surface of a sphere 130 should be used, which can be easily achieved by a bilinear or quadratic interpolation using quaternions to linearize the distances on the spherical surface.

As an alternative to interpolating the maps, the incoming navigators may be matched to the closest fit in the map(s). By fitting a quadratic error surface to this mean-square error match and its spatially closest neighbors in the map, and finding the minimum of this surface, a refined estimate of the matching angle may be calculated without the need for explicitly interpolating the navigator map(s). More specifically, the best fit rotation angle may be calculated as $A_{min}=-\text{inv}(H)*G$ where H is the Hessian matrix calculated in the region of the best fit in a similar manner to that described above, and G is the gradient (e.g., first partial derivatives of the error with respect to the rotation angles). $A_{min}$ and G can both be column vectors of 3 elements corresponding to the three angles of rotation. In addition, $A_{min}$ can be the refined offset from the best fit.

FIG. 11 shows an exemplary embodiment of a scan sequence of the navigators to be used for collecting and extrapolating the image as a function of the data obtained from comparison of the pre-mapped data and the actual navigator data (step 120 of FIG. 2). This drawing shows the scan sequence of the conventional imaging kernel with embedded navigators in each block, preferably between the image line readout and the spoilers, arranged in a predetermined number of partitions, each having a particular number of lines which are provided via Cartesian coordinates. The scan which utilizes these kernels is preferably the only scan where the first read-out of the ADC is activated. In an exemplary embodiment of the present invention, there may be two reads per block. The first read is provided for the line, and the second read is provided for the navigator. The first read not being activated for the map or prescan. Indeed, a line (at any one time) of p k-space samples is scanned, read or acquired using the sequence. Thus, the entire scan of n×m lines results in an n×m×p voxel k-space volume. The navigator may also precede the line after the RF pulse.

Then, the k-space volume (m×n×p) is transformed into an image space volume (m×n×p) using, e.g., the Fourier Transform. In addition, the octant navigator is acquired for each line, and this navigator is compared with the data of the navigator map to determine the magnitudes of the rotations of the object (∈∀, ∈∃, ∈∃). The translations can then be determined by comparing the phase of the octant navigator in question with its best match in the map (♠x, ♠y, ♠z) using the following equation $F[j(x+\spadesuit x, y+\spadesuit y, z+\spadesuit z)=F(u, v, w) \; e^{j2\pi(ux_0+vy_0+wz_0)}$, with u, v, w being spatial frequencies in each of the three dimensions of k-space. The values are then provided back to the next block that is rotated by (Δα, Δβ, Δγ) before the acquisition when the next line is scanned. In particular, the gradients of each block are rotated according to the octant navigator from the previous block. The translations are corrected by adjusting the phase of the k-space volume data. This can be achieved during the scan or thereafter. In addition, it is possible for all the corrections (including the rotation) to be performed offline after the scan is completed.

Figure 12:
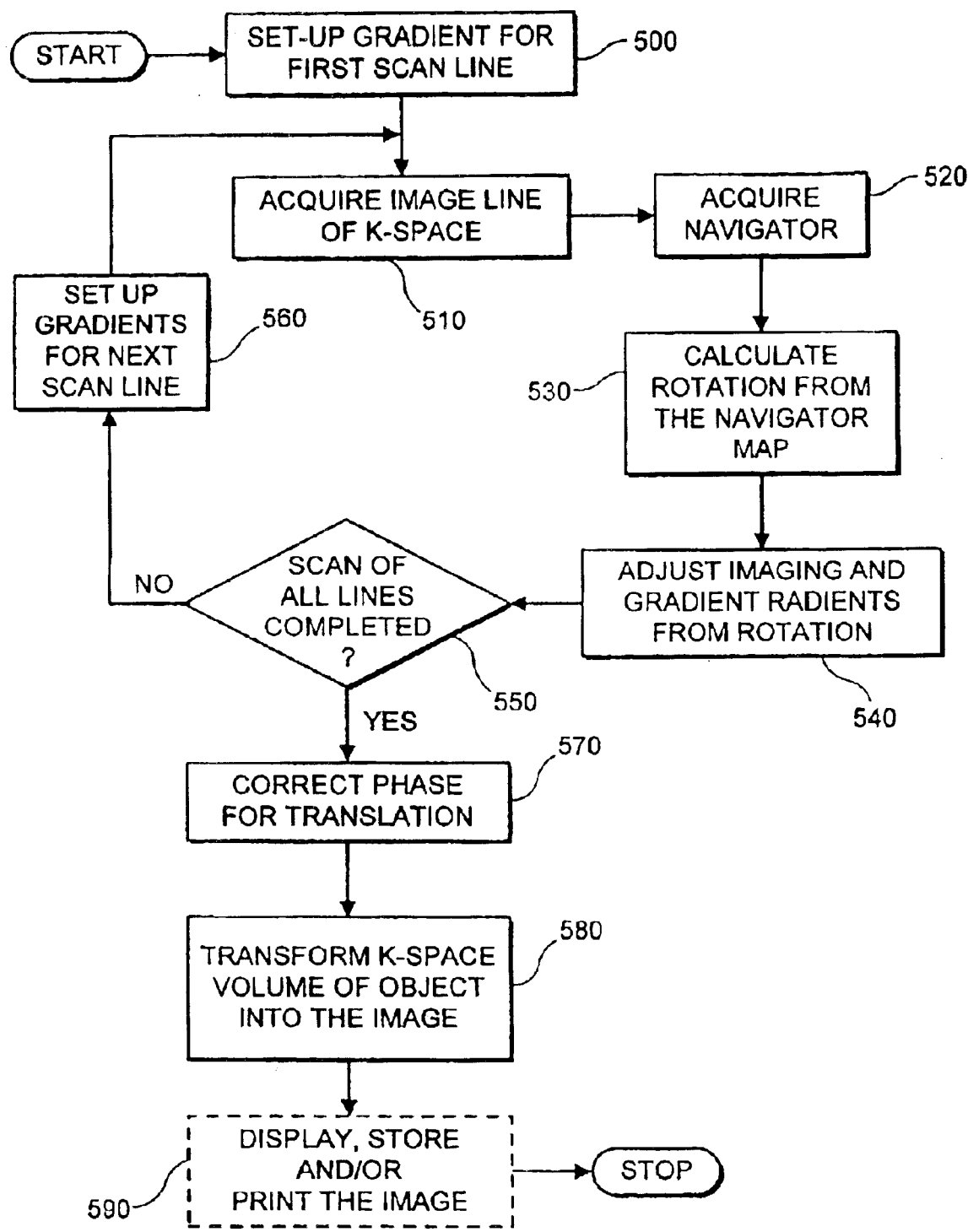
FIG. 12 shows an exemplary portion of the method according to the present invention in which the image of the object is transformed and corrected (in real-time) using the navigators.

FIG. 12 shows an exemplary embodiment of a portion of the method according to the present invention which utilizes the previously described scan and the scan sequence, and in which the image of the object is transformed and corrected (in real-time) using the navigator. In this exemplary method, the gradients associated with the first scan line of the volume to be scanned are set up in step 500, and the k-space is acquired for such scanned line (step 510). Then, in step 520, the octant and/or clover leaf navigator associated with such scanned line is acquired. The rotation of the navigator is calculated using the comparison between the actual navigator at the scanned line and the data from the map (step 530), and then the gradient is adjusted using the calculated rotation (step 540).

Thereafter, in step 550, it is determined whether all lines were scanned or acquired. If not, the gradients (possibly modified/rotated) are set up for the next line to be scanned or acquired (step 560), and the process is returned to step 510 to acquire the next line and begin the calculations for the navigator associated with the next line. Otherwise, the phase for the translations are corrected using the previously corrected gradients and the phase errors between the navigators and the map (step 570). Then, in step 580, the k-space volume of the object is transformed into the image, with the rotation and/or motion taken in consideration. It should be understood that the steps 500–580 are preferably performed by the processing arrangement 40 shown in FIG. 1. It is possible for the image to be displayed on the display device 10, stored in the database 20 or printed by the printer 30 (step 590) to be possibly used for further analysis and/or for comparison purposes. In addition, the trace of the motion (e.g., a table/graph of rotations/translations) may similarly be displayed/stored/printed whether the motion was corrected or simply measured.

Figure 13:
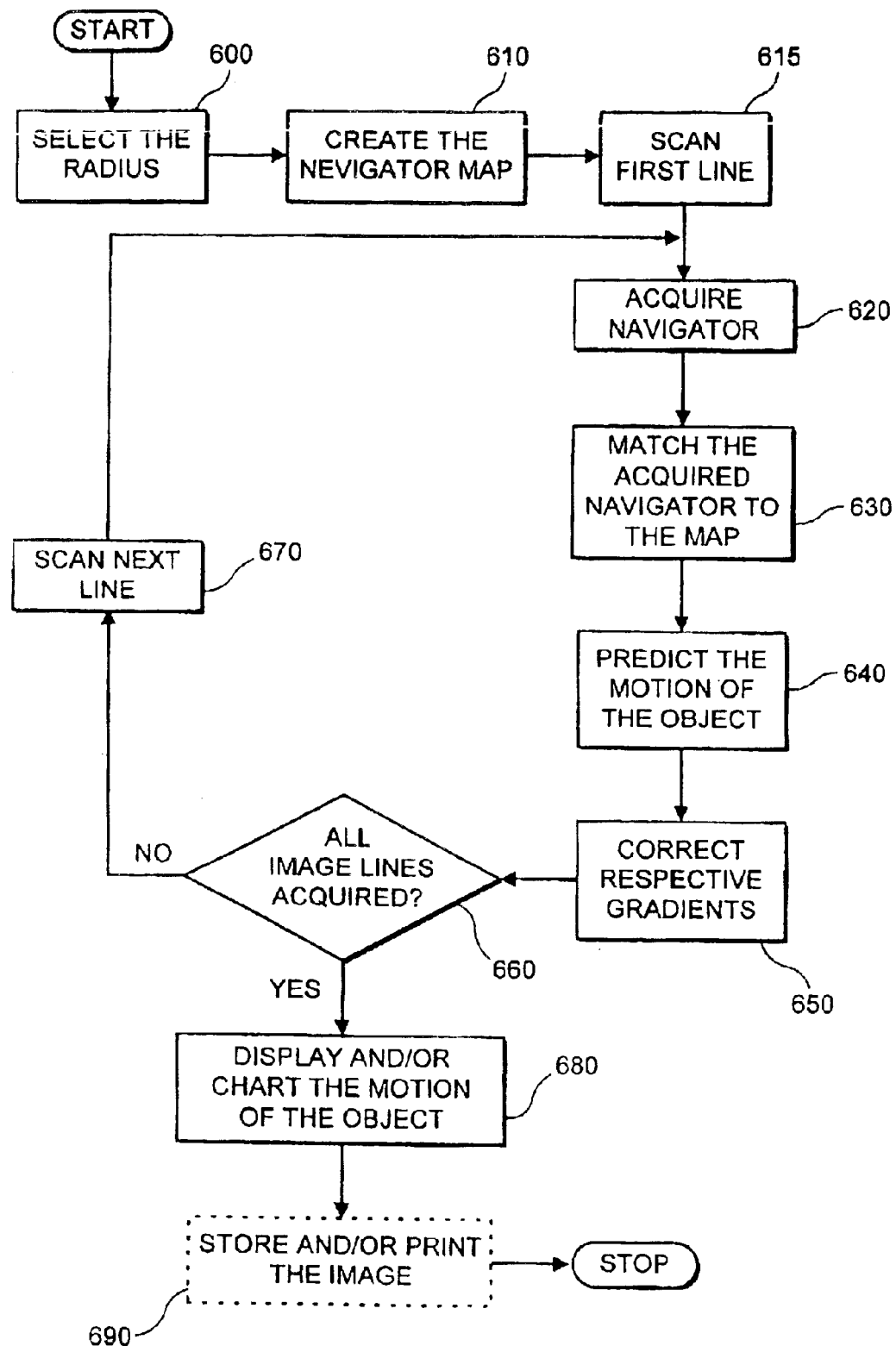
FIG. 13 shows another exemplary embodiment of the method according to the present invention for tracking and correcting a motion of the anatomical object in real time.

Other embodiment of the system and method according to the present invention are conceivable. For example, FIG. 13 shows another exemplary embodiment of the method according to the present invention for tracking and correcting a motion of the anatomical object in real time. In particular, the optimal radius is selected in step 600. This radius selection has been described in great detail above, e.g. in a "pre-mapping radius selection" or in a "concentric navigator" scan. Then, in step 610, the navigator map is created. Two exemplary embodiments of the navigator maps (i.e., n×n×n and q+q+q) have been described above in detail. The navigator for the selected scanned line is acquired (step 620), and this navigator is matched and/or compared to the data of the acquired map (step 630). Thereafter, in step 640, the motion of the object can be predicted, and in step 650, the respective gradients are corrected using the predicted motion of the object and the results of the calculation of step 630. Furthermore, certain models (e.g., an ARMA model) can be used to forecast the position of the object so that further motion between the time of the navigator and the subsequent correction of the gradients can be accounted for, even if the motion is oscillatory. A feedback may also be achieved using a feedback control system with a state estimator such as a linear-quadratic-Gaussian controller with the state estimated by a Kalman filter.

In step 660, it is determined whether all image lines were scanned or obtained. If not, the next line is scanned or obtained (step 670), and the process is returned to step 620 to begin the calculations for the navigator associated with the next line. Otherwise, in step 680, the image and/or data corresponding to the motion of the object can be displayed on the display device 10. In addition, the image may be stored in the database 20 and/or printed by the printer 30 (step 690). Furthermore, the motion data (e.g., the rotations and/or translations) may be displayed, stored or printed.

Alternative Embodiment Employing Navigators (e.g., Clover Leaf Navigators)

In an alternative embodiment of the present invention, the above-described system may implement an estimation of rotations and using clover leaf navigators instead of, or in addition to, the octant navigators set forth in the above-described embodiments. For example, the clover leaf navigator may use a path through k-space that includes a straight-line section in each direction through the center of k-space to gauge translations, and approximately ninety degree arcs in three perpendicular planes to gauge rotations.

Figure 14:
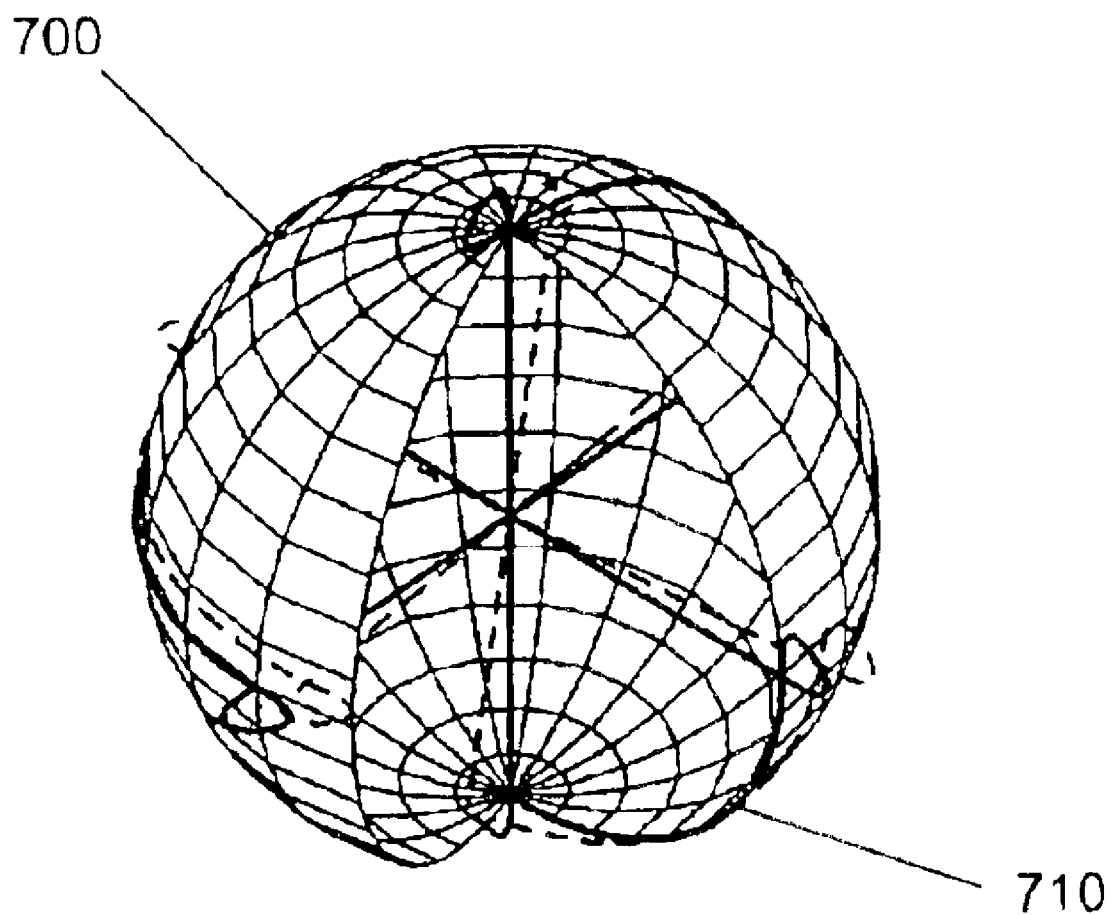
FIG. 14 shows an illustration of an exemplary navigator path in k-space that circumscribes a clover leaf section on a spherical surface of k-space.

FIG. 14 illustrates an exemplary k-space path 710 of the clover leaf navigator shown in connection with a sphere 700 in k-space according to an exemplary embodiment of the present invention. As shown, a K-space sphere 700 corresponds to positional data of an object to be tracked. An exemplary path 710 of the clover leaf navigator preferably passes through the center of the k-space sphere 700. The clover leaf navigators can preferably be formed using the gradients of control signals generated by the sensor arrangement 50 (shown in FIG. 1) on the three axes. These gradients may be used in a k-space readout for tracing the path 710 for the clover leaf navigators.

Figure 15:
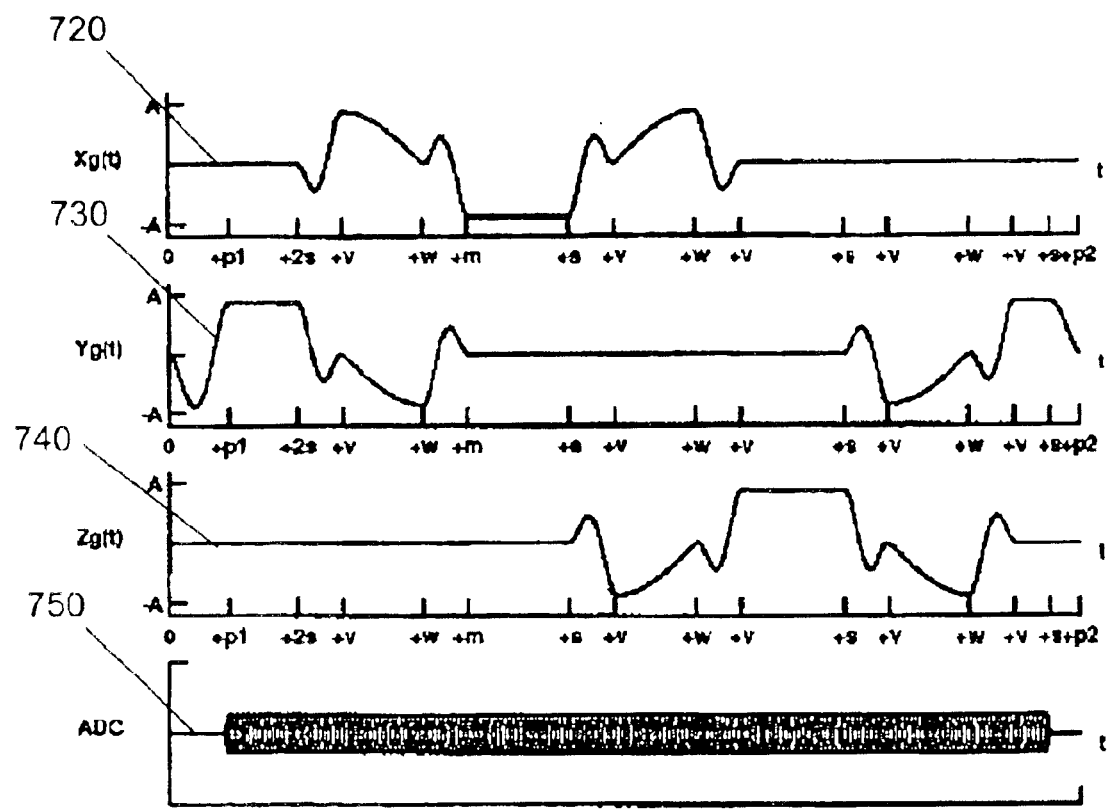
FIG. 15 shows an exemplary clover leaf navigator pulse sequence kernel according to the present invention.

FIG. 15 shows a graph of an exemplary embodiment of an exemplary clover leaf navigator pulse sequence kernel. The clover leaf navigator kernel can include three gradients: a phase gradient Xg(t) 720, a readout gradient Yg(t) 730, and a slice gradient Zg(t) 740. FIG. 15 also shows that an analog-to-digital converter ("ADC") 750 can provide a read-out signal, which occurs during a central part of the gradient waveforms. During such time, the clover leaf navigator path 710 (FIG. 14) and the transitions at the navigator's corners may be traced out.

Figure 16:
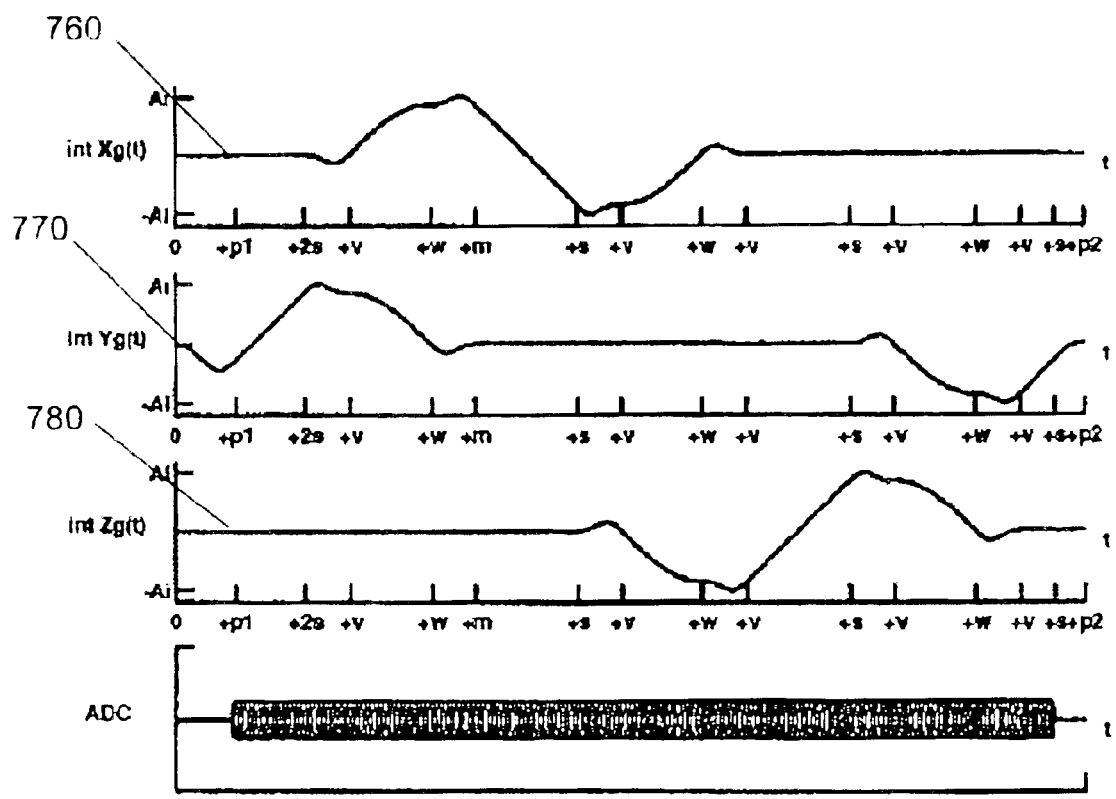
FIG. 16 shows exemplary gradient integrals that represent the position of the clover leaf navigator in k-space according to the present invention.

FIG. 16 shows the exemplary gradient integrals int Xg(t) 760, int Yg(t) 770, and int Zg(t) 780, that represent the position of the clover leaf navigator in k-space, in accordance with an exemplary embodiment of the present invention. As is shown in FIG. 16, a sampling of the straight-line sections of the path of the clover leaf navigator may be asymmetrical in the first and last segments to ensure that there is a continuous traversal through the center of k-space for each axis. The clover leaf navigator kernel is not limited by either its SNR or its sample rate. Preferably, the maximum radius in k-space may be limited by the slew rate at the rounded corners. In an alternative embodiment of the clover leaf navigator kernel, the kernel may exclude a full ninety degrees along each quarter circle of the sphere, but rather round the edges inside the sphere. This can save time, and improve the fidelity of the path that is actually followed in k-space after eddy current compensation is performed.

Figure 17:
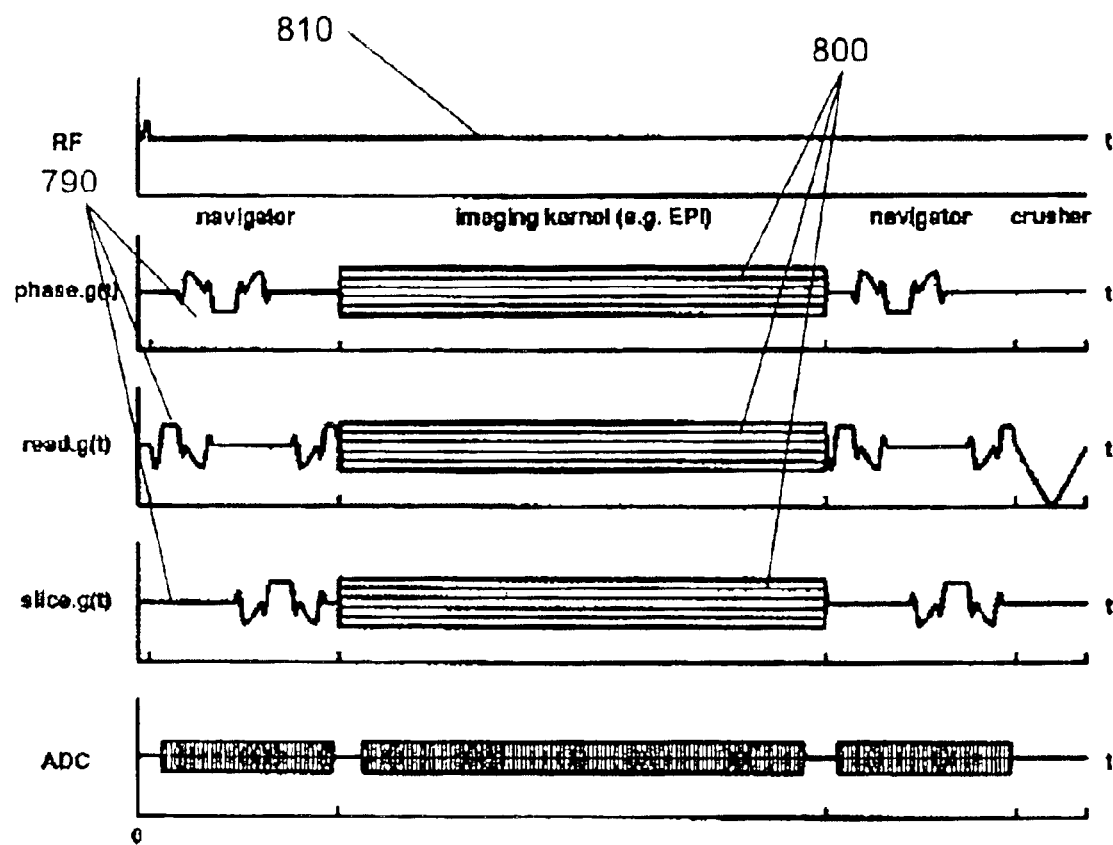
FIG. 17 shows an exemplary three dimensional clover leaf navigator implementation according to the present invention.

The clover leaf navigator may be implemented in either three dimensions or two dimensions. For example, in the three dimensional clover leaf navigator implementation, the example of which is depicted in FIG. 17, the clover leaf navigator 790 may be inserted before and/or after the imaging kernel readout 800, and can share the RF excitation pulse 810. For the two dimensional implementation, the clover leaf navigator may be inserted in a block of its own with a low energy slab-selective excitation pulse, so that there is sufficient signal to estimate rotation about and translation along the axis perpendicular to the plane of the two dimensional slice.

In the clover leaf navigator, rotations can be described using quaternions, which may have certain advantages. First, using quaternions may avoid the problem of gimbal lock, which can occur when angle rotations that are described relative to the cardinal axes result in an alignment of two axes such that a degree of freedom is lost. Additionally, rotations may be better described using quaternion mathematics. Moreover, unlike matrices, quaternions can represent a rigid body rotation without accumulating errors over successive multiplications. This may be important in feedback cases in which a series of small corrections can be applied to the gradient rotation.

Figure 18:
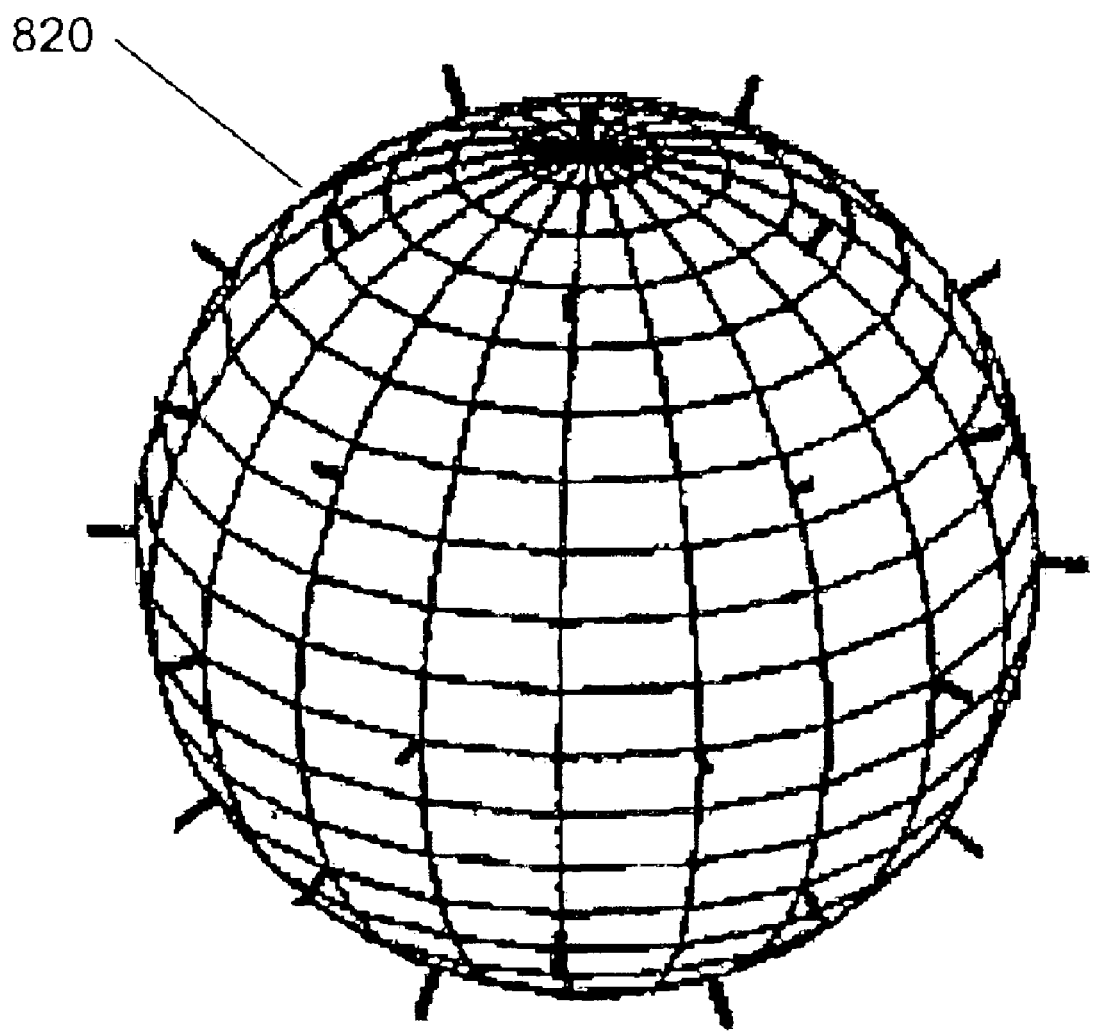
FIG. 18 shows an exemplary clover leaf navigator map according to the present invention.

Quaternions can be easily obtained from axis-angle combinations. In an exemplary embodiment of a clover leaf navigator map 820 according to the present invention, which is depicted in FIG. 18, a clover leaf navigator is rotated through every combination of a table of angles {−10°, −5°, −2°, −1°, 0°, 1°, 2°, 5°, 10°} and rotation a The rotation axes may be, for example, the vectors representing the equally spaced points on a supertessellated icosahedron with 42 vertices (one tessellation up from the 12-vertex icosahedron)

as shown in FIG. 18. This exemplary embodiment provides 378 navigators in the map 820. Repeated maps can be collected and compared to eliminate motion during the mapping procedure.

In another exemplary embodiment of the present invention, the object's motion can be calculated from a new navigator and the navigator map using a robust linear method. The linear method can yield noisier estimates than nonlinear methods, but is likely less computationally intensive and generally degrades gracefully in the presence of noise.

For example, let N represent a column vector of samples acquired along the clover leaf navigator path in k-space. Let $N_i$, where $i \in \{1, \ldots, N\}$, represent a map of navigators, collected along N axis-angle combinations, and represent this map as a matrix M, where $M=[N_1 \ldots N_N]$.

Each clover leaf navigator in the map can be acquired with the gradients rotated to correspond with the particular axis-angle combination. The axes may be selected, for example, from the 42 equally spaced points on a sphere, and the angles may be, for example, selected from a table $\{-2°, -1.5°, -1°, -0.5°, 0°, 0.5°, 1°, 1.5°, 2°\}$. The mapping code is preferably modular, however, and those of skill in the art will appreciate that the choice of angles and axes can be easily modified.

In addition, let $R_i$ represent the rigid body rotation matrix corresponding to the i-th axis-angle combination in the map. Then let $a_i$ represent the vector of elemental angles corresponding with rotation i, as follows:

$$(R_i)^{1/n} = \begin{vmatrix} 1 & -a_{3,i}/n & -a_{2,i}/n \\ a_{3,i}/n & 1 & -a_{1,i}/n \\ a_{2,i}/n & a_{1,i}/n & 1 \end{vmatrix}$$

Further, let A represent the matrix of elemental rotation vectors $a_i$ where $i \in \{1, \ldots N\}$. Then, a weighting matrix W relating to the rotations using the map may be defined as A=WM The weighting matrix may then be calculated by the equation $W=(M^TM+rI)^{-1}M_i$, where the regularization term r is a fraction such as $10^{-6}$ of the mean of the diagonal elements of M.

This matrix can be calculated after the map is measured and before any observations of navigators during imaging. Once W is available, a new estimate of the elemental rotation â for a new navigator observation N can be made rapidly by evaluating the simple expression â=WN.

Using the clover leaf navigators, translations may be calculated from the phase difference between the possibly translated clover leaf navigator and a reference navigator, which is preferably the average zero-rotation navigator in the map. The translations can be proportional to the slope of the phase in each direction across the center of k-space or can be calculated by cross-correlating the FFT of the straight portion of the possibly translated navigator and that of the average zero-rotation navigator in the map.

A plurality of separate scans may be automatically aligned with one another if they use the same type of navigator and share a common map collected once before all the subsequent aligned scans.

The foregoing exemplary embodiments merely illustrate the principles of the present invention. Various modifications and alterations to the described embodiments will be apparent to those skilled in the art in view of the teachings herein without departing from the spirit and scope of the invention being defined by the appended claims. For example, the above exemplary embodiment have been described with particular reference to and use by the MRI imaging systems and techniques. However, the exemplary of the system and method according to the present invention can be used by other imaging systems and methods, such as CAT scanning systems and methods.

What is claimed is:

1. A method of correcting for a motion of an object, comprising the steps of:

obtaining first data for the object, the first data including data defining a navigator and a path of the navigator, the navigator path including a segment that extends through at least a portion of a k-space region corresponding to positional data for the object;

obtaining second data for the object, the second data defining a map of the object; and correcting for at least one of a translation and a rotation of the object as a function of the first data and second data.

2. The method according to claim 1, wherein the correcting step includes comparing the first data with the second data to obtain comparison data.

3. The method according to claim 2, wherein the correcting step is performed repeatedly in real time.

4. The method according to claim 3, wherein the first data further defines the navigator path to include a second segment that extends substantially along the surface of the k-space region.

5. The method according to claim 4, wherein the navigator path defined by the first data is a clover leaf navigator path including straight traversals through the center of the k-space region.

6. The method according to claim 5, wherein the navigator includes a plurality of gradients.

7. The method according to claim 6, wherein the navigator path defined by the first data is a three-dimensional structure.

8. The method according to claim 7, wherein the k-space region is spherical.

9. The method according to claim 8, wherein the navigator path defined by the first data lies substantially outside the k-space region.

10. The method according to claim 8, wherein the navigator path defined by the first data lies substantially within the k-space region.

11. The method according to claim 7, wherein the second data is obtained as a function of the first data.

12. The method according to claim 11, wherein the rotation of the object is described using quaternions.

13. The method according to claim 10, further comprising the step of:

obtaining third data for the object, the third data including data for a further navigator, the further navigator including the gradients, wherein the correcting step includes the substep of correcting the gradients of the second navigator as a function of the first data and second data.

14. The method according to claim 12, wherein the correcting step further comprises the substep of modifying the second data as a function of the comparison data.

15. The method according to claim 13, wherein the correcting step further comprises the substep of modifying the second data as a function of the comparison data.

16. The method according to claim 11, further comprising the step of repeatedly modifying at least one of the translation and the rotation of the object using a feedback control system.

17. The method according to claim 13, further comprising the steps of:

obtaining fourth data for the object, the fourth data including data for a further navigator, the further navigator including the gradients, wherein the correcting step includes the substep of correcting the gradients of the further navigator as a function of the first data, the second data, and the third data; and aligning the third data and the fourth data with reference to the second data.

18. The method according to claim 1, wherein the object is an anatomical structure.

19. A system for correcting for a motion of an object, comprising:

a processor configured to:
obtain first data for the object, the first data defining a navigator and a path of the navigator, the navigator path including a segment that extends through at least a portion of a k-space region corresponding to positional data for the object,
obtain second data for the object, the second data defining a map of the object, and
correct for at least one of a translation and a rotation of the object as a function of the first data and second data.

20. The system of claim 19, wherein the processor is further configured to repeatedly modify at least one of the translation and the rotation of the object using a feedback control system.

21. A software arrangement provided for correcting a motion of an object, comprising:

a first module programmed to obtain first data for the object, the first data defining a navigator and a path of the navigator, the navigator path including a segment that extends through at least a portion of a k-space region corresponding to positional data for the object;

a second module programmed to obtain second data for the object, the second data defining a map of the object; and a third module programmed to correct for at least one of a translation and a rotation of the object as a function of the first data and second data.

22. The software arrangement of claim 21, further comprising a fourth module programmed to repeatedly correct at least one of a translation and a rotation using a feedback control system.

* * * * *